US010395713B2

(12) United States Patent
Han et al.

(10) Patent No.: US 10,395,713 B2
(45) Date of Patent: *Aug. 27, 2019

(54) ONE-TRANSISTOR SYNAPSE CELL WITH WEIGHT ADJUSTMENT

(71) Applicant: International Business Machines Corporation, Armonk, NY (US)

(72) Inventors: Jin Ping Han, Fishkill, NY (US); Xiao Sun, Pleasantville, NY (US); Teng Yang, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/859,583

(22) Filed: Dec. 31, 2017

(65) Prior Publication Data

US 2019/0096463 A1 Mar. 28, 2019

Related U.S. Application Data

(63) Continuation of application No. 15/717,023, filed on Sep. 27, 2017.

(51) Int. Cl.
G06N 3/06 (2006.01)
G11C 11/22 (2006.01)
H03K 19/177 (2006.01)

(52) U.S. Cl.
CPC ........ G11C 11/223 (2013.01); G11C 11/2255 (2013.01); G11C 11/2257 (2013.01); H03K 19/1776 (2013.01)

(58) Field of Classification Search
CPC .............. G11C 11/223; G11C 11/2255; G11C 11/2257; G11C 2213/50; H03K 19/1776
See application file for complete search history.

(56) References Cited

U.S. PATENT DOCUMENTS 4,961,002 A * 10/1990 Tam ........................ G06N 3/063
365/185.03
5,010,512 A * 4/1991 Hartstein ................ G06N 3/063
706/18

(Continued)

OTHER PUBLICATIONS

Kim et al. ("Analog CMOS-based Resistive Processing Unit for Deep Neural Network Training", IEEE Symposium, Aug. 2017).*

(Continued)

*Primary Examiner* — Mushfique Siddique
(74) *Attorney, Agent, or Firm* — L. Jeffrey Kelly; Otterstedt, Wallace & Kammer, LLP

(57) ABSTRACT

Word lines intersect bit lines at a plurality of cross points where a plurality of single memory transistor synapse cells are located. Each cell includes a memory transistor; a pulse shaping unit coupled to a given one of a plurality of signal lines and a gate of the memory transistor; a logic gate having inputs coupled to a corresponding one of the word lines and a corresponding one of the bit lines, and an output coupled to the pulse shaping unit; and a pass gate arrangement. The latter is coupled to the memory transistor, the corresponding one of the word lines, the corresponding one of the bit lines, and the output of the logic gate. Pulses are applied to the gate of the memory transistor for weight adjustment during update and to interconnect the memory transistor to the corresponding one of the bit lines during inference.

9 Claims, 5 Drawing Sheets

(56) References Cited

U.S. PATENT DOCUMENTS

| | | | | |
|---|---|---|---|---|
| 9,466,362 B2* | 10/2016 | Yu | ............... | G11C 13/0026 |
| 9,852,790 B1* | 12/2017 | Gokmen | ............ | G11C 13/0007 |
| 9,934,838 B1* | 4/2018 | Han | ............ | G11C 11/2273 |
| 2015/0170025 A1* | 6/2015 | Wu | ............... | G06N 3/0445 |
| | | | | 706/25 |
| 2016/0267379 A1* | 9/2016 | Eleftheriou | ......... | G11C 11/5678 |
| 2017/0091620 A1* | 3/2017 | Gokmen | ............... | G06F 17/16 |
| 2017/0109628 A1* | 4/2017 | Gokmen | ............ | G06N 3/0472 |
| 2018/0012123 A1* | 1/2018 | Han | ............ | H01L 27/092 |
| 2018/0053089 A1* | 2/2018 | Gokmen | ............ | G06N 3/0635 |

OTHER PUBLICATIONS

Gokmen et al. ("Acceleration of Deep Neural Network Training with Resistive Cross-Point Devices: Design Considerations", Frontier in Neuroscience, Jul. 2016).*

Gokmen, Tayfun, and Yurii Vlasov, "Acceleration of Deep Neural Network Training with Resistive Cross-Point Devices: Design Considerations." Frontiers in Neuroscience 10 (2016), published: Jul. 21, 2016, Jul. 2016, vol. 10, Article333, pp. 1-13.

Jin-Ping Han, unpublished U.S. Appl. No. 15/202,729, filed Jul. 6, 2016, FET Based Synapse Network, pp. 1-28 plus 9 sheets drawings.

Wikipedia, "Deep learning," pp. 1-36, page last modified on Mar. 4, 2017, downloaded Mar. 11, 2017 from https://en.wikipedia.org/w/index.php?title=Deep_learning&oldid=768564058.

Jin Ping Han et al., unpublished U.S. Appl. No. 15/717,023, filed Sep. 27, 2017, Circuitry for One-Transistor Synapse Cell and Operation Method of the Same, pp. 1-24 plus 5 sheets of drawings.

Paul J. Otterstedt, List of IBM Patents or Patent Applications Treated as Related, Sep. 10, 2018, pp. 1-2.

* cited by examiner

| WL | BL | SL | ACTION |
|---|---|---|---|
| ANALOG | 0 | 1/0 | READ-OUT: F (INFERENCE) |
| 0 | ANALOG | 1/0 | READ-OUT: B (BACKWARD PROPAGATION) |
| 1 | 1 | 1 | UPDATE + |
| 1 | 1 | 0 | UPDATE − |
| 0 | 0 | 1/0 | HOLD, NO SIGNAL |

FIG. 8

| WL | BL | SL | ACTION |
|---|---|---|---|
| 101000... | 0 | 1 | READ-OUT: F (INFERENCE) |
| 101000... | 1 | 0 | READ-OUT: B (BACKWARD PROPAGATION) |
| 1 | 1 | 1 | UPDATE + |
| 1 | 1 | 0 | UPDATE − |
| 0 | 0 | 1/0 | HOLD, NO SIGNAL |

ONE-TRANSISTOR SYNAPSE CELL WITH WEIGHT ADJUSTMENT

CROSS-REFERENCE TO RELATED APPLICATIONS

This application is a continuation of U.S. patent application Ser. No. 15/717,023 filed Sep. 27, 2017, the complete disclosure of which is expressly incorporated herein by reference in its entirety for all purposes

BACKGROUND

The present invention relates to the electrical, electronic, and computer arts, and more specifically, to cognitive computing devices.

A one-transistor synapse memory cell has the potential for neuromorphic computation; however within a unit cell, additional circuitry is needed to (1) facilitate read and update of the cell within a large network; and (2) eliminate, or at least mitigate, non-ideal effects, such as the asymmetric update.

SUMMARY

Embodiments of the present disclosure provide circuitry for a one-transistor synapse cell and a corresponding operation method. According to an embodiment of the present invention, an exemplary memory circuit includes a plurality of word lines; a plurality of bit lines intersecting the plurality of word lines at a plurality of cross points; a plurality of signal lines; and a plurality of single memory transistor synapse cells located at the plurality of cross points. Each of the cells in turn includes a memory transistor having a gate; a pulse shaping unit coupled to a given one of the signal lines and the gate of the memory transistor; a logic gate having inputs coupled to a corresponding one of the word lines and a corresponding one of the bit lines, and having an output coupled to the pulse shaping unit; and a pass gate arrangement coupled to the memory transistor, the corresponding one of the word lines, the corresponding one of the bit lines, and the output of the logic gate. The pulse shaping unit, the logic gate, and the pass gate arrangement are cooperatively configured to apply pulses to the gate of the memory transistor for weight adjustment during an update operation and to interconnect the memory transistor to the corresponding one of the bit lines during an inference operation.

According to another embodiment of the present invention, an exemplary method includes providing a memory circuit of the kind just described; applying pulses to the gate of the memory transistor for weight adjustment during an update operation, using the pulse shaping unit, the logic gate, and the pass gate arrangement; and interconnecting the memory transistor to the corresponding one of the bit lines during an inference operation, using the pulse shaping unit, the logic gate, and the pass gate arrangement.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments provide one or more of:

synapse unit cells based on one-transistor memory cell, e.g., Ferroelectric FET (FeFET), to realize INFERENCE and UPDATE functions in a large neuron network;

a circuit design to sample the state of the one-transistor memory cell and provide feedback to a pulse shaping unit for enhanced updating;

a design which reduces or eliminates non-ideal effects, such as asymmetric update, in a one-transistor synapse memory cell;

a novel digital INFERENCE scheme which improves upon the conventional analog INFERENCE scheme by utilizing the binary digital input and the analog weight.

These and other features and advantages of the present invention will become apparent from the following detailed description of illustrative embodiments thereof, which is to be read in connection with the accompanying drawings.

BRIEF DESCRIPTION OF THE DRAWINGS

FIG. 8 depicts an operation table for the cell of FIG. 5, according to an aspect of the invention.

DETAILED DESCRIPTION

As noted, a one-transistor synapse memory cell has the potential for neuromorphic computation; however within a unit cell, additional circuitry is needed to (1) facilitate inference and update of the cell within a large network; and (2) eliminate, or at least mitigate, non-ideal effects, such as the asymmetric update. A deep neural network (DNN) is an artificial neural network (ANN) with multiple hidden layers of units between the input and output layers. DNNs stochastically update weights during training. One or more embodiments can be used to implement enhanced (e.g., more ideal) weight updating and inference for DNNs.

One or more embodiments provide several circuit designs of a synapse unit cell based on a one-transistor memory cell; e.g., Ferroelectric FET (FeFET), to realize INFERENCE and UPDATE functions in a large neuron network. One or more embodiments further provide a circuit design to sample the state of the one-transistor memory cell and provide feedback to the pulse shaping unit for more ideal updating. One or more embodiments yet further provide a novel digital INFERENCE scheme in addition to the conventional analog INFERENCE scheme.

Indeed, one or more embodiments provide a unit cell circuit design for a one-transistor synapse which uses the analog input style for inferencing in a neural network circuit; a unit cell circuit design for a one-transistor synapse which uses the digital input style for inferencing in a neural network circuit, and the operation in the network scale of the same; and/or a unit cell circuit design for a one-transistor synapse with an automatic sampling and feedback circuit for more ideal weight updating.

Figure 1:
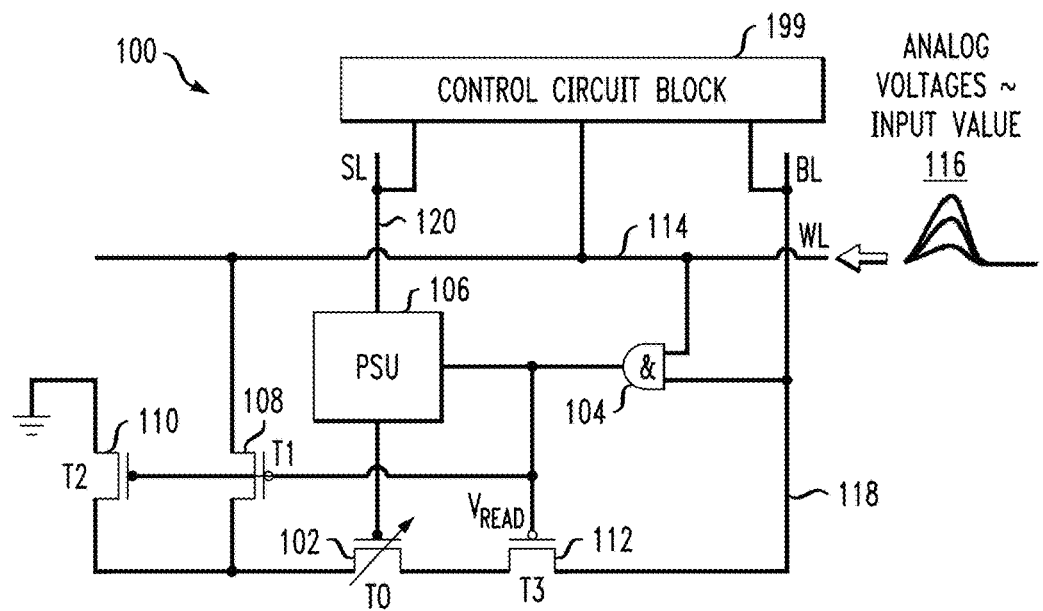
FIG. 1 depicts an exemplary synapse cell design with an analog inference scheme, according to an aspect of the invention.

With reference now to FIG. 1, which depicts a first exemplary embodiment of a synapse cell design with an analog inference scheme, a single unit cell 100 includes one novel memory FET T0 that is not the commonly adopted RAM (DRAM, SRAM etc.), e.g., FeFET, numbered 102; one AND (&) gate 104; one pulse shaping unit (PSU) 106; and several pass-gate transistors T1, numbered 108; T2, numbered 110; and T3, numbered 112. The weight will be represented by the channel conductance of T0 102; the input by the analog voltage level 116 through the word line WL 114, and the output by the integrated channel current through the bit line BL 118. The SL signal 120 is discussed below. The PSU 106 applies voltages for inferring and updating weights, as well as adjusting the pulse delay, pulse width and pulse amplitude to update weight value for a certain type of memory cell. The AND(&) gate 104 may output binaries; in addition, it can also output analog signals on WL when BL is 1, and output "0" when BL is "0". Note that the convention used herein is that a p-type MOSFET (PMOS) has an open circle, while an n-type MOSFET (NMOS) has no dot or a solid dot.

Still referring to FIG. 1, during the analog inference operation, the voltage of BL 118 is "0" making the output of AND gate 104 "0" to turn on the pass-gate P-type transistors T1 108 and T3 112, and turn off the N-type pass-gate transistor T2 110. The analog voltage from the WL 114 results in a drain current in T0 102 to BL 118. The "0" output of the AND gate 104 causes the PSU 106 to apply a fixed read voltage on the gate of T0 102. In one or more embodiments, the SL signal is not pertinent at the INFERENCE stage.

Figure 2:
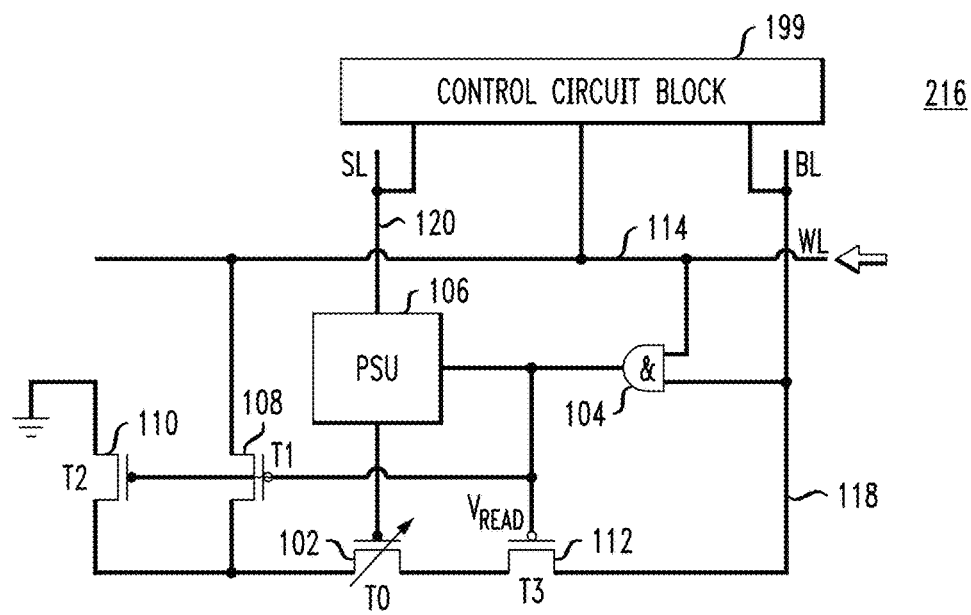
FIG. 2 depicts an update operation of the cell of FIG. 1, according to an aspect of the invention.

Referring to FIG. 2, during the UPDATE operation, as at 216, binary input with arbitrary duty cycles or probabilities of "1" pulses are input from WL 114 and BL 118, representing the vector x and δ in the value of weight change ΔW=x. δ respectively during the weight update of the neural network algorithms. See Tayfun Gokmen and Yurii Vlasov, "Acceleration of Deep Neural Network Training with Resistive Cross-Point Devices: Design Considerations," *Frontiers in Neuroscience* 10 (July 2016), article 333, pages 1-13, expressly incorporated herein by reference in its entirety for all purposes. If the AND gate outputs a "1" or a positive analog voltage, the drain of T0 102 is grounded through T2 110, the T1 108 is off, and the PSU 106 generates UPDATE pulses to the gate of T0 102. The source of T0 102 is floating as T3 112 coupled to it is turned off by the AND gate output. The SL line 120 determines whether the PSU UPDATE pulse from PSU 106 is positive or negative for, respectively, increasing or decreasing the weight.

Figures 3, 4:
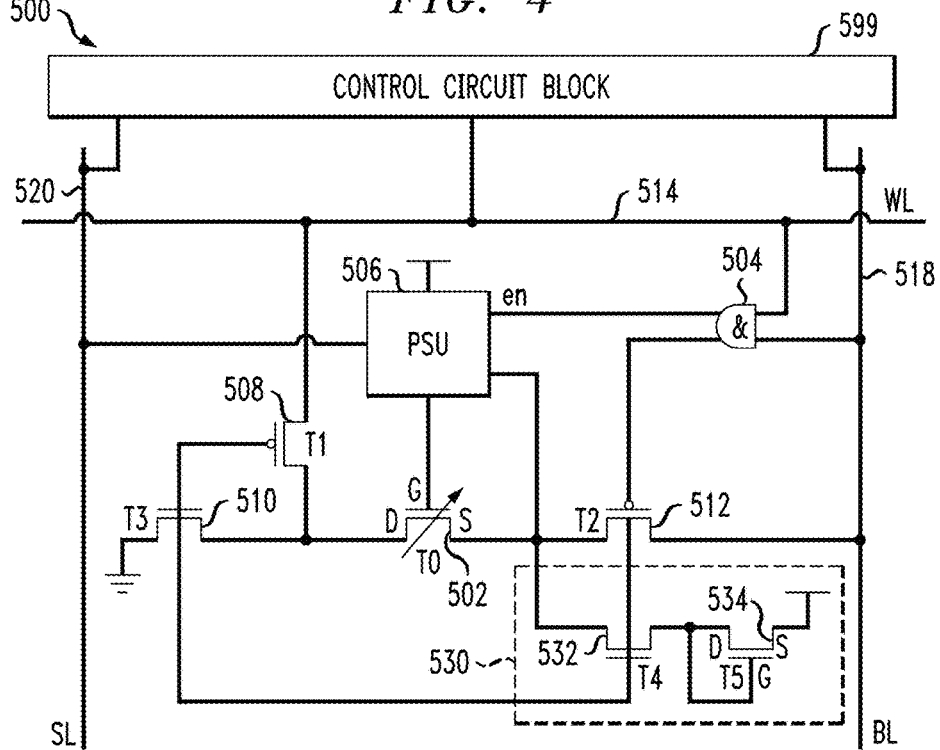
FIG. 3 depicts an operation table for the cell of FIG. 1, according to an aspect of the invention.
FIG. 4 depicts an exemplary synapse cell design with feedback update, according to an aspect of the invention.

The table of FIG. 3 shows the states of the WL 114, BL 118, and SL 120, during various actions. As seen in the first row of entries, during the read for analog inference (readout F), WL 114 is analog, BL 118 is "0," and SL 120 can have a value of "1" or "0." As seen in the second row of entries, during the read for back propagation (readout B), BL 118 is analog, WL 114 is "0," and SL 120 can have a value of "1" or "0." As seen in the third row of entries, during update+, WL 114 is "1," BL 118 is "1," and SL 120 is "1." As seen in the fourth row of entries, during update −, WL 114 is "1," BL 118 is "1," and SL 120 is "0." No inference or update is done in the fifth row when WL 114 and BL 118 are both "0" (hold).

With reference now to FIG. 4, which depicts a second exemplary embodiment 500 of a synapse cell design with an analog inference scheme, a feedback circuit 530 is added to the design of FIG. 1 to sample the conductance state of T0 502 and feed the same back to PSU 506 for adjusting the pulses on the gate of T0 502. The INFERENCE scheme for the embodiment of FIG. 4 is same as for the embodiment of FIG. 1 without feedback circuit. BL 518, WL 514, and SL 520 are analogous to elements 118, 114, 120 in FIG. 1. Feedback circuit 530 includes T4 532 and T5 534 described further below.

As shown in FIG. 4, during the UPDATE operation of the circuit 500 with feedback, if the AND gate 504 outputs a "1," T1 508 and T2 512 are turned off. The drain of T0 502 is grounded through T3 510, and the PSU 506 generates UPDATE pulses to the gate of T0 502. The PSU also receives a feedback signal from the feedback unit 530 including T4 532 and T5 534. The "1" output of AND gate 504 turns T4 532 ON and in turn this causes T5 534 to force a small current through T0 502, resulting in a voltage on the source of T4 532. This voltage is proportional to the channel conductance of T0 502 and is fed back to the PSU 506 for adjusting the pulse properties. Note that the source of T5 534 is connected to a rail with a non-zero voltage value.

Figure 5:
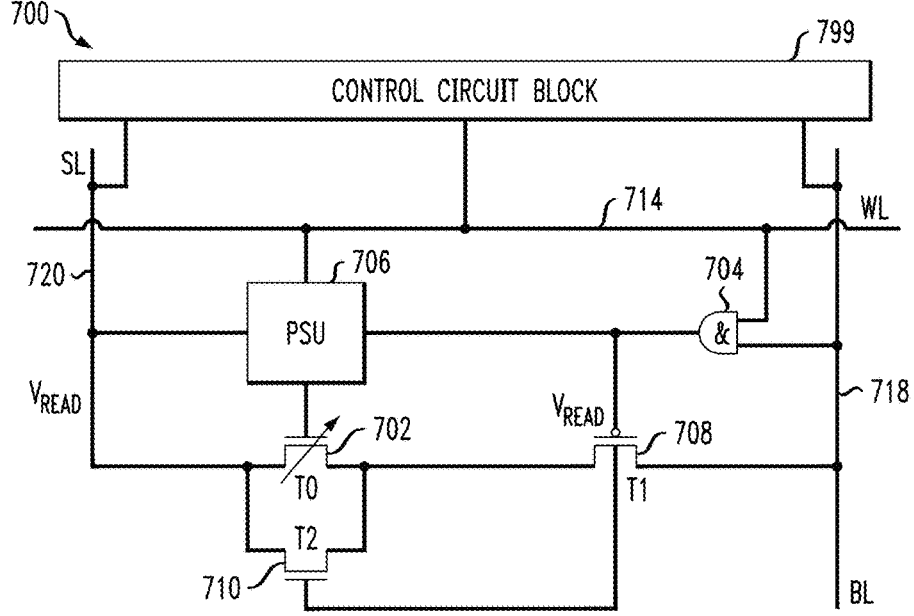
FIG. 5 depicts an exemplary synapse cell design with a digital inference scheme, according to an aspect of the invention.

With reference now to FIG. 5, which depicts a third exemplary embodiment 700 of a synapse cell design with a digital inference scheme, a single unit cell includes one novel memory FET T0 702, e.g., FeFET; one AND (&) gate 704; one pulse shaping unit (PSU) 706; and several pass-gate transistors T1 708 and T2 710. The weight will be represented by the channel conductance of T0 702; the input by the digital I/O string through the word line WL 714; and the output by the integrated channel current through bit line BL 718 over the INFERENCE period. The design of FIG. 5 can also be used with a FEEDBACK circuit as in the design of FIG. 4; see discussion of FIG. 6 below. Note signal SL 720.

As shown in FIG. 5, during the digital inference operation, the BL 718 is "0" so that the AND gate 704 outputs a "0" to turn on the pass-gate T1 708 and turn off T2 710. The output "0" of the AND gate 704 and SL value of "1" cause the PSU 706 to pass the WL signal to the gate of T0 702. The WL 714 provides a string of I/O pulses representing each digit of the binary input.

Figure 6:
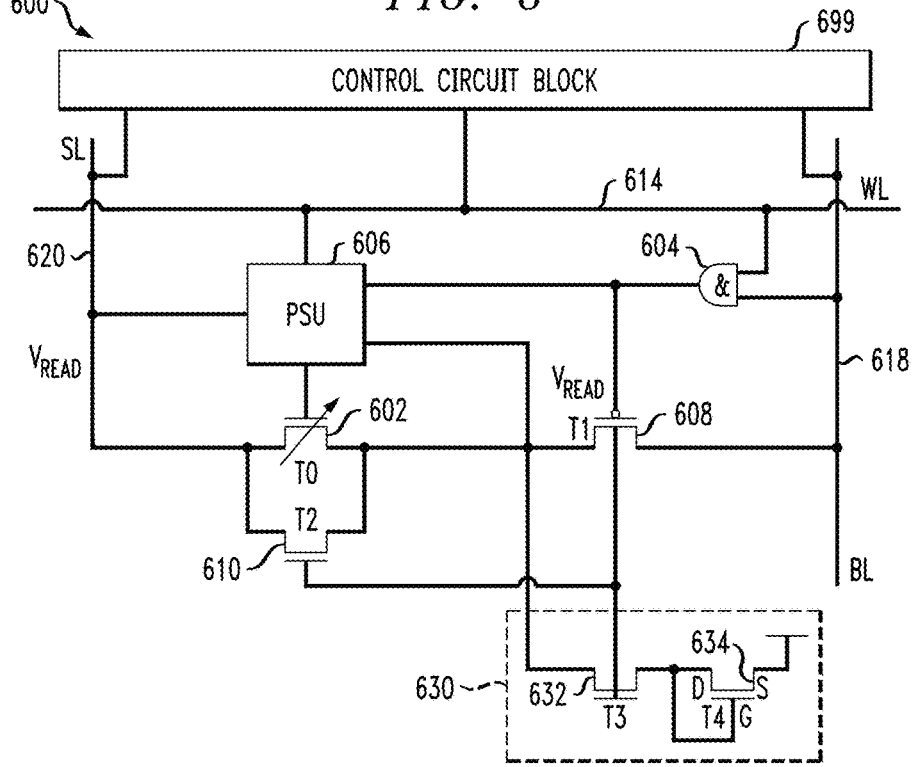
FIG. 6 depicts the exemplary synapse cell design of FIG. 5 with feedback, according to an aspect of the invention.

As noted, the design of FIG. 5 can also be used with a FEEDBACK circuit as in the design of FIG. 4; this is depicted as design 600 in FIG. 6. Elements 602, 604, 606, 608, 610, 614, 618, 620, 699 are analogous to elements 702, 704, 706, 708, 710, 714, 718, 720, 799 in FIG. 5. Feedback circuit 630 operates analogously to feedback circuit 530 in FIG. 4; transistor T3 632 is analogous to transistor T4 532 and transistor T4 634 is analogous to transistor T5 534.

Figure 7:
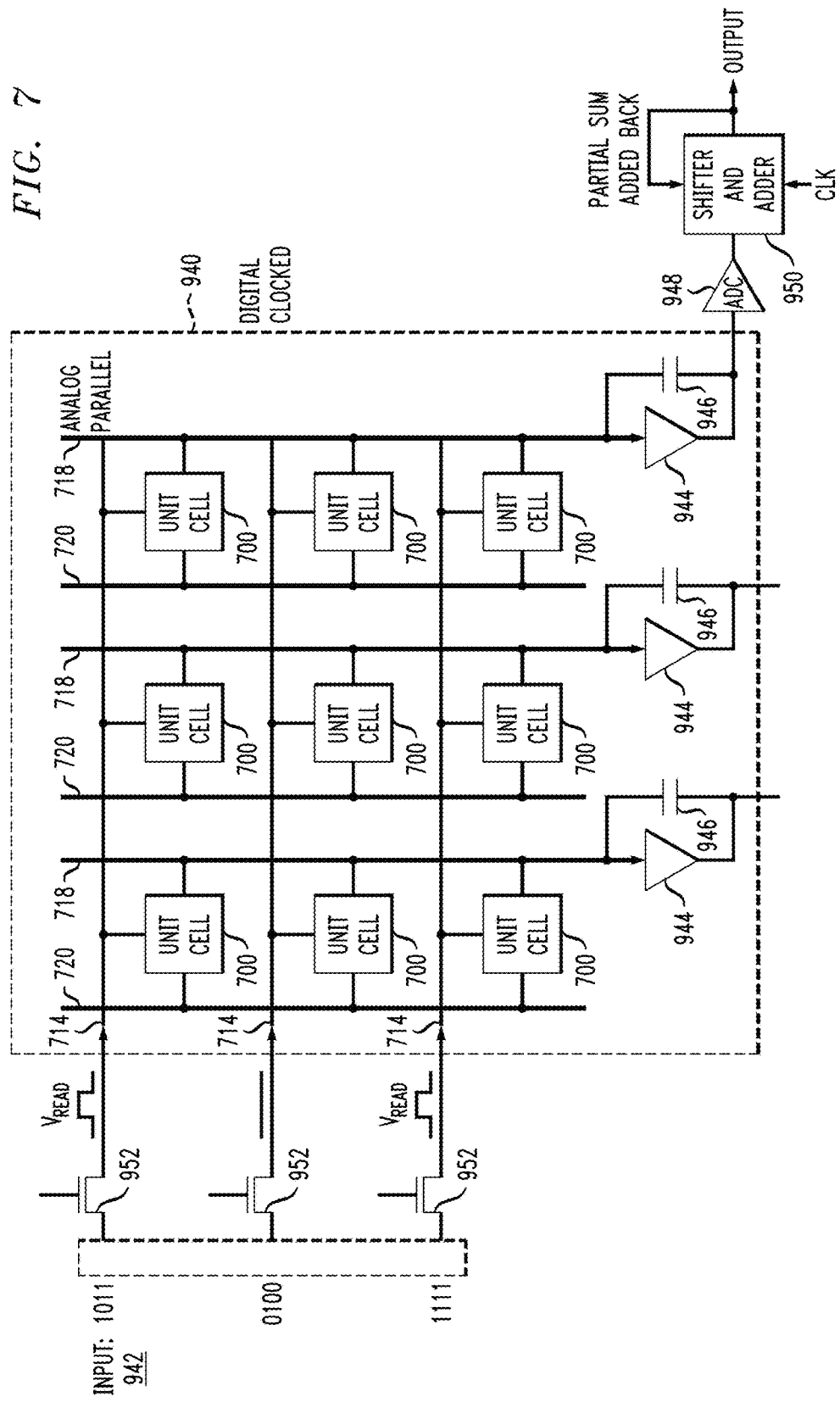
FIG. 7 depicts an exemplary digital inference scheme within a network, according to an aspect of the invention.

FIG. 7 shows exemplary operation of the DIGITAL INFERENCE scheme in a network. The portion within the dotted line 940 is an analog parallel circuit, while that outside is a digital clocked circuit. The input 942, after digital processing (normalization, non-linearization, etc. of the previous layer's output) is in binary form (i.e., a string of "1" and "0" bits). The input is selectively provided to a given row via transistors 952 bit by bit. Instead of going through a digital-to-analog converter (DAC), each bit of the input 942 will go through the WL 714 to generate a pulse or "0", which becomes the product of the input of that bit and weights. In operation of a single column (or row), for each bit of the input ranging from the least significant bit to the most significant bit, an op-amp 944 integrates the differential current on the corresponding capacitor 946, and an analog-to-digital converter ADC 948 converts the same to digital. The shifter and adder 950 shifts and adds the digital output for each bit of the input after multiplying by the weight and obtains the final sum representing the product between the multi-bit input and the weight. To realize this, the shifter and adder 950 has a feedback loop to add the produce value for a new bit of the input to the partial sum it has calculated.

As shown in FIG. 5, during the UPDATE operation of the circuit 700, binary input with arbitrary duty cycles or probabilities of "1" pulses are input from WL and BL, representing vector x and δ in ΔW=x. δ respectively during the weight update of neural network algorithms. If the AND gate 704 outputs "1," T2 710 is turned on and T1 708 is turned off. The voltage of the source and drain of T0 702 follows SL 720, whose value instructs PSU 706 to generate positive or negative pulses. If SL 720 is "1" (high voltage), PSU 706 will apply a low voltage to the gate of T0 702, decreasing the weight; If SL720 is "0," PSU 706 will apply a high voltage to the gate of T0, increasing the weight.

The table of FIG. 8 shows the states of the WL 714, BL 718, and SL 720, during various actions. As seen in the first row of entries, during the read for digital inference (readout F), WL 714 is digital, BL 718 is "0," and SL 720 is "1." As seen in the second row of entries, during the read for back propagation (readout B), WL 714 is digital, BL 718 is "1," and SL 720 is "0." As seen in the third row of entries, during update +, WL 714 is "1," BL 718 is "1," and SL 720 is "1." As seen in the fourth row of entries, during update −, WL 714 is "1," BL 718 is "1," and SL 720 is "0." No inference or update is done in the fifth row when WL 714 and BL 720 are both "0" (hold).

Given the discussion thus far, it will be appreciated that, in general terms, an exemplary memory circuit, according to an aspect of the invention, includes a plurality of word lines WL such as 114, 514, 714; a plurality of bit lines BL such as 118, 518, 718 intersecting the plurality of word lines at a plurality of cross points; and a plurality of signal lines SL such as 120, 520, 720. A plurality of single memory transistor synapse cells such as 100, 500, 700 are located at the plurality of cross points. Each of the cells in turn includes a memory transistor T0 such as 102, 502, 702 having a gate G; and a pulse shaping unit PSU such as 106, 106, 506, 706 coupled to a given one of the signal lines SL and the gate of the memory transistor T0. Each of the cells further includes a logic gate such as AND gate 104, 504, 704 and a pass gate arrangement (e.g., T1, T2, T3 in FIGS. 1-3, 5, and 6; T1 and T2 in FIGS. 7, 8, and 10). The logic gate has inputs coupled to a corresponding one of the word lines WL and a corresponding one of the bit lines BL, and has an output coupled to the pulse shaping unit PSU. The pass gate arrangement is coupled to the memory transistor T0, the corresponding one of the word lines WL, the corresponding one of the bit lines BL, and the output of the logic gate (e.g., AND gate 104, 504, 704). The pulse shaping unit PSU, the logic gate (e.g., AND gate 104, 504, 704), and the pass gate arrangement are cooperatively configured to apply pulses to the gate of the memory transistor T0 for weight adjustment during an update operation and to interconnect the memory transistor T0 to the corresponding one of the bit lines BL during an inference operation.

In a non-limiting example, the memory transistors include ferroelectric field effect transistors, floating-gate transistors, and/or charge-trapping-gate transistors.

Referring particularly now to FIGS. 1-3, in some embodiments, the logic gate includes an AND gate 104 and the memory transistor 102 includes an n-type field effect transistor having first and second drain-source terminals. The skilled artisan will appreciate that in field effect transistors the drain and source are essentially interchangeable; the skilled artisan will appreciate from the schematic in the figures whether a particular drain-source terminal is functioning as a drain or source in a particular instance. For example, in FIGS. 1-2, the leftmost drain-source terminal of T0 is functioning as a drain D and the rightmost drain-source terminal of T0 is functioning as a source S.

Furthermore, the pass gate arrangement includes a first pass gate p-type field effect transistor T1 108 having a first drain-source terminal coupled to the corresponding one of the word lines WL 114, a second drain-source terminal coupled to the first one of the drain-source terminals of the memory transistor T0 102, and a gate coupled to the output of the AND gate 104. The pass gate arrangement also includes a pass gate n-type field effect transistor T2 110 having a first drain-source terminal coupled to ground, a second drain-source terminal coupled to the second drain-source terminal of the first p-type pass gate field effect transistor T1 108, and a gate coupled to the output of the AND gate 104. The pass gate arrangement further includes a second pass gate p-type field effect transistor T3 112 having a first drain-source terminal coupled to the second one of the drain-source terminals of the memory transistor T0 102, a second drain-source terminal coupled to the corresponding one of the bit lines BL 118, and a gate coupled to the output of the AND gate 104.

In one or more embodiments, the memory circuit further includes a control circuit block 199 coupled to the plurality of word lines WL, the plurality of bit lines BL and the plurality of signal lines SL. During an analog inference operation, the control circuit block is configured to set a corresponding one of the bit lines BL 118 to logical zero, causing the AND gate 104 to output a logical zero to turn on the first and second pass gate p-type field effect transistors T1 108 and T3 112 and causing the pulse shaping unit PSU 106 to apply a fixed read voltage to the gate of the memory transistor T0 102. During an update operation, the control circuit block is configured to cause binary input on the corresponding one of the word lines WL 114 and the corresponding one of the bit lines BL 118 such that when the corresponding one of the word lines and the corresponding one of the bit lines both have a logical one value, the AND gate 104 outputs a logical one to turn off the first and second pass gate p-type field effect transistors T1 108 and T3 112 and turn on the pass gate n-type field effect transistor T2 110 to ground the first drain-source terminal of the memory transistor T0 102, and cause the corresponding one of the signal lines SL 120 to control the pulse shaping unit PSU 106 to apply, as the case may be, positive pulses to increase the weight or negative pulses to decrease the weight.

Referring now to FIG. 4, in some embodiments, each of the cells further includes a feedback circuit 530 interconnected with the memory transistor T0 502 and the pulse shaping unit PSU 506 to sample a conductance state of the memory transistor T0 502 and feed the conductance state back to the pulse shaping unit PSU 506 to adjust the pulses on the gate of the memory transistor T0 502 during the update operation. In some embodiments employing feedback, the logic gate includes an AND gate 504; the memory transistor includes an n-type field effect transistor T0 502 having first and second drain-source terminals (leftmost functioning as a drain and rightmost functioning as a source in this instance); and the pass gate arrangement includes a first p-type pass gate field effect transistor T1 508 having a first drain-source terminal coupled to the corresponding one of the word lines WL 514, a second drain-source terminal coupled to the first one of the drain-source terminals of the memory transistor T0 502, and a gate coupled to the output of the AND gate 504. The pass gate arrangement further includes a pass gate n-type field effect transistor T3 510 having a first drain-source terminal coupled to ground, a second drain-source terminal coupled to the second drain-source terminal of the first p-type pass gate field effect transistor T1 508, and a gate coupled to the output of the AND gate 504. The pass gate arrangement even further includes a second pass gate p-type field effect transistor T2 512 having a first drain-source terminal coupled to the second one of the drain-source terminals of the memory transistor T0 502, a second drain-source terminal coupled to the corresponding one of the bit lines BL 518, and a gate coupled to the output of the AND gate 504.

In a non-limiting example, the feedback circuit 530 includes a first feedback n-type field effect transistor T4 532 having a gate coupled to the output of the AND gate 504, a first drain-source terminal coupled to the second drain-source terminal of the memory transistor T0 502 and the pulse shaping unit PSU 506, and a second drain-source terminal; and a second feedback n-type field effect transistor T5 534 having a gate, a first drain-source terminal (here functioning as a drain D) coupled to the gate of the second feedback n-type field effect transistor and the second drain-source terminal of the first feedback n-type field effect transistor T4 532, and a second drain-source terminal (here functioning as a source S) a fixed voltage bias such as the power rail.

In one or more embodiments, the memory circuit further includes a control circuit block 599 coupled to the plurality of word lines WL 514, the plurality of bit lines BL 518, and the plurality of signal lines SL 520. During an analog inference operation, the control circuit block is configured to set a corresponding one of the bit lines BL 518 to logical zero, causing the AND gate 504 to output a logical zero to turn on the first and second pass gate p-type field effect transistors T1 508 and T2 512, and causing the pulse shaping unit PSU 506 to apply a fixed read voltage to the gate of the memory transistor T0 502. During an update operation, the control circuit block is configured to cause binary input on the corresponding one of the word lines WL 514 and the corresponding one of the bit lines BL 518 such that when the corresponding one of the word lines and the corresponding one of the bit lines both have a logical one value, the AND gate 504 outputs a logical one to turn off the first and second pass gate p-type field effect transistors T1 508 and T2 512 and turn on the pass gate n-type field effect transistor T3 510 to ground the first drain-source terminal of the memory transistor T0 502, and cause the corresponding one of the signal lines SL 520 to control the pulse shaping unit to apply, as the case may be, positive pulses to increase the weight or negative pulses to decrease the weight. The pulse shaping unit also receives a feedback signal from the feedback circuit 530—the second feedback n-type field effect transistor T5 534 forcing a small current through the memory transistor T0 502, resulting in a voltage on the second drain-source terminal of the memory transistor T0 502, proportional to a channel conductance of the memory transistor T0 502.

Referring now to FIGS. 5-8, in some embodiments the logic gate includes an AND gate 704; the memory transistor T0 702 includes an n-type field effect transistor having first and second drain-source terminals; and the pass gate arrangement includes a pass gate p-type field effect transistor T1 708 having a first drain-source terminal coupled to the second drain-source terminal of the memory transistor, a second drain-source terminal coupled to the corresponding one of the bit lines BL 718, and a gate coupled to the output of the AND gate 704. The pass gate arrangement further includes a pass gate n-type field effect transistor T2 710 having a first drain-source terminal coupled to the first drain-source terminal of the memory transistor, a second drain-source terminal coupled to the second drain-source terminal of the memory transistor, and a gate coupled to the output of the AND gate 704. The first drain-source terminal of the pass gate n-type field effect transistor T2 710 and the first drain-source terminal of the memory transistor T0 702 are coupled to a corresponding one of the signal lines SL 720.

In one or more embodiments, the memory circuit further includes a control circuit block 799 coupled to the plurality of word lines WL 714, the plurality of bit lines BL 718, and the plurality of signal lines SL 720. During a digital inference operation, the control circuit block is configured to set a corresponding one of the bit lines BL 718 to logical zero and a corresponding one of the signal lines SL 720 to a logical one, causing the AND gate 704 to output a logical zero to turn on the pass gate p-type field effect transistor T1 708 and the pulse shaping unit PSU 706 to pass a binary input signal on the corresponding one of the word lines WL 714 to the gate of the memory transistor T0 702. During an update operation, the control circuit block is configured to cause binary input on the corresponding one of the word lines WL 714 and the corresponding one of the bit lines BL 718 such that when the corresponding one of the word lines and the corresponding one of the bit lines both have a logical one value, the AND gate 704 outputs a logical one to turn off the pass gate p-type field effect transistor T1 708 and turn on the pass gate n-type field effect transistor T2 710, and to cause the corresponding one of the signal lines to control the pulse shaping unit PSU 706 to apply, as the case may be, positive pulses to increase the weight or negative pulses to decrease the weight. Positive and negative in this embodiment refer to the polarity of voltages applied from gate to S/D.

In another aspect, an exemplary method of operating a memory circuit is provided. The method includes providing a memory circuit having any one, some, or all of the features described herein. The method further includes applying pulses to the gate of the memory transistor for weight adjustment during an update operation, using the pulse shaping unit, the logic gate, and the pass gate arrangement; and interconnecting the memory transistor to the corresponding one of the bit lines during an inference operation, using the pulse shaping unit, the logic gate, and the pass gate arrangement. The skilled artisan will appreciate from the description of the method steps and the above description of the circuit and its operation which embodiment(s) are applicable to each method step.

In some cases, further steps involve a control circuit block, during an analog inference operation, setting a corresponding one of the bit lines to logical zero causing the AND gate to output a logical zero to turn on the first and second pass gate p-type field effect transistors and causing the pulse shaping unit to apply a fixed read voltage to the gate of the memory transistor; and, during an update operation, causing binary input on the corresponding one of the word lines and the corresponding one of the bit lines such that when the corresponding one of the word lines and the corresponding one of the bit lines both have a logical one value, the AND gate outputs a logical one to turn off the first and second pass gate p-type field effect transistors and turn on the pass gate n-type field effect transistor to ground the first drain-source terminal of the memory transistor, and causing the corresponding one of the signal lines to control the pulse shaping unit to apply, as the case may be, positive pulses to increase the weight or negative pulses to decrease the weight.

In some cases, further steps include sampling a conductance state of the memory transistor; and feeding the conductance state back to the pulse shaping unit to adjust the pulses on the gate of the memory transistor during the update operation.

In some cases, further steps involve a control circuit block, during an analog inference operation, setting a corresponding one of the bit lines to logical zero causing the AND gate to output a logical zero to turn on the first and second pass gate p-type field effect transistors and causing the pulse shaping unit to apply a fixed read voltage to the gate of the memory transistor; and, during an update operation, causing binary input on the corresponding one of the word lines and the corresponding one of the bit lines such that when the corresponding one of the word lines and the corresponding one of the bit lines both have a logical one value, the AND gate outputs a logical one to turn off the first and second pass gate p-type field effect transistors and turn on the pass gate n-type field effect transistor to ground the first drain-source terminal of the memory transistor, and causing the corresponding one of the signal lines to control the pulse shaping unit to apply, as the case may be, positive pulses to increase the weight or negative pulses to decrease the weight, the pulse shaping unit also receiving a feedback signal from the feedback circuit, the second feedback n-type field effect transistor forcing a small current through the memory transistor, resulting in a voltage on the second drain-source terminal of the memory transistor, proportional to a channel conductance of the memory transistor.

In some cases, further steps involve a control circuit block, during a digital inference operation, setting a corresponding one of the bit lines to logical zero and a corresponding one of the signal lines to a logical one, causing the AND gate to output a logical zero to turn on the pass gate p-type field effect transistor and the pulse shaping unit to pass a binary input signal on the corresponding one of the word lines to the gate of the memory transistor; and, during an update operation, causing binary input on the corresponding one of the word lines and the corresponding one of the bit lines such that when the corresponding one of the word lines and the corresponding one of the bit lines both have a logical one value, the AND gate outputs a logical one to turn off the pass gate p-type field effect transistor and turn on the pass gate n-type field effect transistor, and causing the corresponding one of the signal lines to control the pulse shaping unit to apply, as the case may be, positive pulses to increase the weight or negative pulses to decrease the weight.

Memory cells according to one more aspects of the present invention may be formed into memory circuits, which may be realized as integrated circuits; thus, at least a portion of the techniques of one or more aspects or embodiments of the present invention described herein may be implemented in an integrated circuit. In forming integrated circuits, a plurality of identical die is typically fabricated in a repeated pattern on a surface of a semiconductor wafer. Each die can include one or more of the cells described herein, and may include other structures or circuits, or other types of cells. The individual die are cut or diced from the wafer, then packaged as an integrated circuit. A person of skill in the art will know how to dice wafers and package die to produce integrated circuits. Integrated circuits so manufactured are considered part of the present invention. Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed. Given the teachings herein, the skilled artisan will be able to select known fabrication techniques to produce circuits in accordance with aspects of the invention; e.g., using techniques as disclosed in James D. Plummer et al., Silicon VLSI Technology (2nd Edition), Prentice Hall, 2008.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any appropriate computing product that includes integrated circuit chips.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method comprising:
providing a memory circuit, said memory circuit comprising:
a plurality of word lines;
a plurality of bit lines intersecting said plurality of word lines at a plurality of cross points;
a plurality of signal lines; and
a plurality of memory transistor synapse cells located at said plurality of cross points, each of said cells comprising:
a memory transistor having a gate;

a pulse shaping unit coupled to a given one of said signal lines and said gate of said memory transistor;

a logic gate having inputs coupled to a corresponding one of said word lines and a corresponding one of said bit lines, and having an output coupled to said pulse shaping unit; and a pass gate arrangement coupled to said memory transistor, said corresponding one of said word lines, said corresponding one of said bit lines, and said output of said logic gate;

applying pulses to said gate of said memory transistor for weight adjustment during an update operation, using said pulse shaping unit, said logic gate, and said pass gate arrangement; and interconnecting said memory transistor to said corresponding one of said bit lines during an inference operation, using said pulse shaping unit, said logic gate, and said pass gate arrangement, wherein, in said providing step:

said logic gate comprises an AND gate;

said memory transistor comprises an n-type field effect transistor having first and second drain-source terminals; and said pass gate arrangement comprises:
a first pass gate p-type field effect transistor having a first drain-source terminal coupled to said corresponding one of said word lines, a second drain-source terminal coupled to said first one of said drain-source terminals of said memory transistor, and a gate coupled to said output of said AND gate;

a pass gate n-type field effect transistor having a first drain-source terminal coupled to ground, a second drain-source terminal coupled to said second drain-source terminal of said first pass gate p-type field effect transistor, and a gate coupled to said output of said AND gate; and a second pass gate p-type field effect transistor having a first drain-source terminal coupled to said second one of said drain-source terminals of said memory transistor, a second drain-source terminal coupled to said corresponding one of said bit lines, and a gate coupled to said output of said AND gate.

2. The method of claim 1, wherein, in said providing step:
said memory circuit further comprises a control circuit block coupled to said plurality of word lines, said plurality of bit lines, and said plurality of signal lines;

further comprising the additional steps of:
during the inference operation, with said control circuit block, setting a corresponding one of said bit lines to logical zero causing said AND gate to output a logical zero to turn on said first and second pass gate p-type field effect transistors and causing said pulse shaping unit to apply a fixed read voltage to said gate of said memory transistor; and during an update operation, with said control circuit block, causing binary input on said corresponding one of said word lines and said corresponding one of said bit lines such that when said corresponding one of said word lines and said corresponding one of said bit lines both have a logical one value, said AND gate outputs a logical one to turn off said first and second pass gate p-type field effect transistors and turn on said pass gate n-type field effect transistor to ground said first drain-source terminal of said memory transistor, and causing said corresponding one of said signal lines to control said pulse shaping unit to apply at least one of positive pulses to increase said weight and negative pulses to decrease said weight.

3. The method of claim 1, wherein, in said providing step, each of said cells further comprises a feedback circuit interconnected with said memory transistor and said pulse shaping unit, further comprising the additional steps of:
sampling a conductance state of said memory transistor; and feeding said conductance state back to said pulse shaping unit to adjust said pulses on said gate of said memory transistor during said update operation.

4. A method comprising:
providing a memory circuit, said memory circuit comprising:
a plurality of word lines;
a plurality of bit lines intersecting said plurality of word lines at a plurality of cross points;
a plurality of signal lines; and
a plurality of memory transistor synapse cells located at said plurality of cross points, each of said cells comprising:
a memory transistor having a gate;
a pulse shaping unit coupled to a given one of said signal lines and said gate of said memory transistor;

a logic gate having inputs coupled to a corresponding one of said word lines and a corresponding one of said bit lines, and having an output coupled to said pulse shaping unit; and a pass gate arrangement coupled to said memory transistor, said corresponding one of said word lines, said corresponding one of said bit lines, and said output of said logic gate;

applying pulses to said gate of said memory transistor for weight adjustment during an update operation, using said pulse shaping unit, said logic gate, and said pass gate arrangement; and interconnecting said memory transistor to said corresponding one of said bit lines during an inference operation, using said pulse shaping unit, said logic gate, and said pass gate arrangement, wherein, in said providing step, said logic gate comprises an AND gate;

said memory transistor comprises an n-type field effect transistor having first and second drain-source terminals;

said pass gate arrangement comprises:
a pass gate p-type field effect transistor having a first drain-source terminal coupled to said second drain-source terminal of said memory transistor, a second drain-source terminal coupled to said corresponding one of said bit lines, and a gate coupled to said output of said AND gate; and a pass gate n-type field effect transistor having a first drain-source terminal coupled to said first drain-source terminal of said memory transistor, a second drain-source terminal coupled to said second drain-source terminal of said memory transistor, and a gate coupled to said output of said AND gate;

said first drain-source terminal of said pass gate n-type field effect transistor and said first drain-source terminal of said memory transistor are coupled to a corresponding one of said signal lines.

5. The method of claim 4, wherein said memory circuit further comprises a control circuit block coupled to said plurality of word lines, said plurality of bit lines, and said plurality of signal lines;
further comprising the additional steps of:
during the inference operation, with said control circuit block, setting a corresponding one of said bit lines to logical zero and a corresponding one of said signal lines to a logical one, causing said AND gate to output a logical zero to turn on said pass gate p-type field effect transistor and said pulse shaping unit to pass a binary input signal on said corresponding one of said word lines to said gate of said memory transistor; and
during an update operation, with said control circuit block, causing binary input on said corresponding one of said word lines and said corresponding one of said bit lines such that when said corresponding one of said word lines and said corresponding one of said bit lines both have a logical one value, said AND gate outputs a logical one to turn off said pass gate p-type field effect transistor and turn on said pass gate n-type field effect transistor, and causing said corresponding one of said signal lines to control said pulse shaping unit to apply either one of positive pulses to increase said weight or negative pulses to decrease said weight.

6. A method comprising:
providing a memory circuit, said memory circuit comprising:
a plurality of word lines;
a plurality of bit lines intersecting said plurality of word lines at a plurality of cross points;
a plurality of signal lines; and
a plurality of memory transistor synapse cells located at said plurality of cross points, each of said cells comprising:
a memory transistor having a gate;
a pulse shaping unit coupled to a given one of said signal lines and said gate of said memory transistor;
a logic gate having inputs coupled to a corresponding one of said word lines and a corresponding one of said bit lines, and having an output coupled to said pulse shaping unit; and
a pass gate arrangement coupled to said memory transistor, said corresponding one of said word lines, said corresponding one of said bit lines, and said output of said logic gate;
applying pulses to said gate of said memory transistor for weight adjustment during an update operation, using said pulse shaping unit, said logic gate, and said pass gate arrangement; and
interconnecting said memory transistor to said corresponding one of said bit lines during an inference operation, using said pulse shaping unit, said logic gate, and said pass gate arrangement, wherein, in said providing step:
each of said cells further comprises a feedback circuit interconnected with said memory transistor and said pulse shaping unit to sample a conductance state of said memory transistor and feed said conductance state back to said pulse shaping unit to adjust said pulses on said gate of said memory transistor during said update operation.

7. The method of claim 6, wherein, in said providing step: said logic gate comprises an AND gate;

said memory transistor comprises an n-type field effect transistor having first and second drain-source terminals;
said pass gate arrangement comprises:
a first p-type pass gate field effect transistor having a first drain-source terminal coupled to said corresponding one of said word lines, a second drain-source terminal coupled to said first one of said drain-source terminals of said memory transistor, and a gate coupled to said output of said AND gate;
a pass gate n-type field effect transistor having a first drain-source terminal coupled to ground, a second drain-source terminal coupled to said second drain-source terminal of said first p-type pass gate field effect transistor, and a gate coupled to said output of said AND gate; and
a second pass gate p-type field effect transistor having a first drain-source terminal coupled to said second one of said drain-source terminals of said memory transistor, a second drain-source terminal coupled to said corresponding one of said bit lines, and a gate coupled to said output of said AND gate.

8. The method of claim 7, wherein, in said providing step: said feedback circuit comprises:
a first feedback n-type field effect transistor having a gate coupled to said output of said AND gate, a first drain-source terminal coupled to said second drain-source terminal of said memory transistor and said pulse shaping unit, and a second drain-source terminal; and
a second feedback n-type field effect transistor having a gate, a first drain-source terminal coupled to said gate of said second feedback n-type field effect transistor and said second drain-source terminal of said first feedback n-type field effect transistor, and a second drain-source terminal coupled to a fixed voltage level.

9. The method of claim 8, wherein, in said providing step: said memory circuit further comprises a control circuit block coupled to said plurality of word lines, said plurality of bit lines, and said plurality of signal lines;
further comprising the additional steps of:
during the inference operation, with said control circuit block, setting a corresponding one of said bit lines to logical zero causing said AND gate to output a logical zero to turn on said first and second pass gate p-type field effect transistors and causing said pulse shaping unit to apply a fixed read voltage to said gate of said memory transistor; and
during an update operation, with said control circuit block, causing binary input on said corresponding one of said word lines and said corresponding one of said bit lines such that when said corresponding one of said word lines and said corresponding one of said bit lines both have a logical one value, said AND gate outputs a logical one to turn off said first and second pass gate p-type field effect transistors and turn on said pass gate n-type field effect transistor to ground said first drain-source terminal of said memory transistor, and causing said corresponding one of said signal lines to control said pulse shaping unit to apply at least one of positive pulses to increase said weight and negative pulses to decrease said weight, said pulse shaping unit also receiving a feedback signal from said feedback circuit, said second feedback n-type field effect transistor forcing a small current through said memory transistor, resulting in a voltage on said second drain-source terminal of said memory transistor, proportional to a channel conductance of said memory transistor.

* * * * *